(12) United States Patent
So

(10) Patent No.: US 6,191,008 B1
(45) Date of Patent: Feb. 20, 2001

(54) METHOD OF FORMING SOI SUBSTRATE WHICH INCLUDES FORMING TRENCHES DURING ETCHING OF TOP SEMICONDUCTOR LAYER

(75) Inventor: Sang Mun So, Kyoungki-do (KR)

(73) Assignee: Hyundai Electronics Industries Co., Ltd., Kyoungki-do (KR)

(*) Notice: Under 35 U.S.C. 154(b), the term of this patent shall be extended for 0 days.

(21) Appl. No.: 09/344,281

(22) Filed: Jun. 30, 1999

(30) Foreign Application Priority Data

Jun. 30, 1998 (KR) .................................................. 98-25282

(51) Int. Cl.⁷ .............................. H01L 21/30; H01L 21/46
(52) U.S. Cl. ............................................ 438/459; 438/977
(58) Field of Search .................................. 438/459, 977; 148/DIG. 126

(56) References Cited

U.S. PATENT DOCUMENTS

| | | | |
|---|---|---|---|
| 4,897,703 | 1/1990 | Spratt et al. ........................ | 357/34 |
| 5,071,792 | * 12/1991 | VanVonno et al. . | |
| 5,137,837 | 8/1992 | Chang et al. ........................ | 437/21 |
| 5,204,282 | * 4/1993 | Tsurata et al. . | |
| 5,336,634 | * 8/1994 | Katayama et al. . | |
| 5,346,848 | * 9/1994 | Grupen-Shemanasky et al. . | |
| 5,480,832 | * 1/1996 | Miura . | |
| 5,585,304 | * 12/1996 | Hayashi et al. . | |
| 5,679,599 | 10/1997 | Mehta ................................... | 437/69 |
| 5,770,484 | 6/1998 | Kleinhenz ............................ | 438/155 |
| 5,856,225 | 1/1999 | Lee et al. ............................. | 438/291 |

FOREIGN PATENT DOCUMENTS 07201972    8/1995    (JP) ............................. H01L/21/76

* cited by examiner

Primary Examiner—John F. Niebling
Assistant Examiner—Ron Pompey
(74) Attorney, Agent, or Firm—Ladas & Parry

(57) ABSTRACT

The present invention provides a method of forming SOI substrate provided with an isolation layer. Since a thinning process is performed at the semiconductor silicon layer after isolation layers are formed on the semiconductor silicon layer, the occurrence of dishing is prevented. The method of forming SOI substrate according to the present invention comprises the steps of: providing a base silicon layer and a semiconductor silicon layer; forming a buried oxide layer on the base silicon layer; forming trenches in the semiconductor silicon layer; boding the base silicon layer and the semiconductor silicon layer so that the buried oxide layer and the trench-formed surface are contacted with each other; removing a selected thickness of the semiconductor silicon layer to obtain a semiconductor layer having a desired thickness, wherein the trenches formed in the semiconductor silicon layer are exposed by removing the selected thickness of the semiconductor silicon layer and the semiconductor layer is separated into a plurality of regions by the exposed trenches; forming an etch stop layer only on the semiconductor layer except the trenches; forming an oxide layer with a thickness sufficient to fill a region between stacked structures comprising the semiconductor layer and the etch stop layer; etching the oxide layer by means of the etch stop layer, wherein an isolation layer is formed at the region between the stacked structure; and removing the etch stop layer.

32 Claims, 6 Drawing Sheets

US 6,191,008 B1

METHOD OF FORMING SOI SUBSTRATE WHICH INCLUDES FORMING TRENCHES DURING ETCHING OF TOP SEMICONDUCTOR LAYER

BACKGROUND OF THE INVENTION

1. Field of the Invention

The present invention relates to a method for manufacturing a semiconductor device, and more particularly to a method of forming a silicon-on-insulator(SOI) substrate provided with an isolation layer.

2. Description of the Related Art

Due to the fast development in semiconductor device such as high integration and high performance, a semiconductor device using the SOI substrate instead of a silicon substrate made of bulk silicon, has been proposed. The SOI substrate has a stack structure of a base substrate as a means for supporting, a buried oxide layer, and a semiconductor layer in which a device is formed later. The semiconductor device formed on the SOI substrate has advantages such as a complete isolation of adjoining devices by the buried oxide layer and especially a reduced the parasitic capacitance and fast operation.

Conventionally, there have been used methods of forming SOI substrate, such as SIMOX(separation by implanted oxygen) and bonding method.

In the method of forming the SOI substrate according to the SIMOX, a silicon substrate is provided and oxygen ions are then ion-implanted at a predetermined depth from an upper surface of the silicon substrate. Afterward, the silicon substrate is annealed so that the ion-implanted oxygen ions react with silicon of the silicon substrate thereby forming the buried oxide layer to divide the silicon substrate into a base layer and a semiconductor layer. However, the SIMOX method has shortcomings that it is difficult to control thickness of the semiconductor layer in which a device is formed later, and a considerable amount of process time is required.

Referring to the method of forming the SOI substrate according to the bonding method, a base silicon layer as a supporting means is provided and a buried oxide layer is formed on the base silicon layer. Next, a semiconductor silicon layer in which a device is formed later, is bonded on the buried oxide layer, and the semiconductor silicon layer is back-polished according to the CMP process, so as to obtain a semiconductor layer having a desired thickness. According to the bonding method, it is easy to control thickness of the semiconductor layer and the bonding method shortens process time, compared to the SIMOX method. Moreover, since the isolation layer may be provided at the semiconductor layer during the manufacturing process of the SOI substrate, a manufacturing step of forming the isolation layer can be deleted from known semiconductor manufacturing processes.

FIGS. 1A to 1D are cross-sectional views showing conventional manufacturing steps of forming the SOI substrate according to a bonding method. Detailed descriptions of the manufacturing method will be discussed with reference to accompanying drawings.

Referring to FIG. 1A, a base silicon layer 1 as a means for supporting is provided and a first oxide layer 2 is then formed on the base silicon layer 1.

Referring to FIG. 1B, a semiconductor silicon layer 3 is provided and trenches 4 are then formed in an upper surface of the semiconductor silicon layer 3 according to a known etching process. Herein, the trench 4 has a depth similar to thickness of a semiconductor layer in which a device is formed later. A second oxide layer 5 is formed with a thickness sufficient to fill the trench 4 completely.

Referring to FIG. 1C, the base layer 1 and the semiconductor silicon layer 3 is bonded such that the first and second oxide layers 2, 5 are contacted with each other. Next, the base silicon layer 1 and the bonded semiconductor silicon layer 3 are annealed so that the bonding intensity therebetween is increased.

Referring to FIG. 1D, the semiconductor silicon layer 3 is back-polished according to the CMP process using the second oxide layer 5 filled in the trench 4 as a polishing stopper. As a result, an SOI substrate 10 comprising the base silicon layer 1, the buried oxide layer 7 formed on the base silicon layer 3, and a semiconductor layer 3a having an isolation layer and disposed on the buried oxide layer 7 is obtained.

In general, the property of a semiconductor device being formed in the SOI substrate depends mainly on the uniformity of semiconductor layer. Accordingly, what is most important is to obtain the uniformity of semiconductor layer in case the SOI substrate is formed according to the bonding method.

As described above, however, when the semiconductor silicon layer is polished so as to obtain a semiconductor layer by a thinning process after isolation layers are formed in the semiconductor silicon layer, there is occurred a dishing D at a surface of the semiconductor layer 3a as shown in FIG. 1D. As a result, thickness of the semiconductor layer 3a is not uniform owing to the occurrence of dishing D. Therefore, when a device is formed on the above semiconductor layer 3a, it is difficult to expect improvements in the device property.

SUMMARY OF THE INVENTION

Accordingly, the present invention provides a method of forming an SOI substrate capable of improving the uniformity in thickness of the semiconductor layer by preventing from occurring the dishing D on the semiconductor layer.

To accomplish foregoing objects, one embodiment of the present invention provides a method of forming SOI substrate comprising the steps of:

providing a base silicon layer and a semiconductor silicon layer;

forming a buried oxide layer on the base silicon layer;

forming trenches in the semiconductor silicon layer;

boding the base silicon layer and the semiconductor silicon layer so that the buried oxide layer and the trench-formed surface are contacted with each other;

removing a selected thickness of the semiconductor silicon layer to obtain a semiconductor layer having a desired thickness, wherein the trenches formed in the semiconductor silicon layer are exposed by removing the selected thickness of the semiconductor silicon layer and the semiconductor layer is separated into a plurality of regions by the exposed trenches;

forming an etch stop layer only on the semiconductor layer except the trenches;

forming an oxide layer with a thickness sufficient to fill a region between stacked structures comprising the semiconductor layer and the etch stop layer;

etching the oxide layer by means of the etch stop layer, wherein an isolation layer is formed at the region between the stacked structure; and removing the etch stop layer.

Another embodiment of the present invention further provides a method of forming SOI substrate comprising the steps of:

providing a base silicon layer and a semiconductor silicon layer;

forming a first oxide layer on the base silicon layer;

forming an impurity layer with a first depth within the semiconductor silicon layer;

forming trenches with a second depth in the semiconductor silicon layer, wherein the second depth is deeper than the first depth;

boding the base silicon layer and the semiconductor silicon layer so that the first oxide layer on the base silicon layer and the trench-formed surface are contacted with each other;

removing a selected thickness of the semiconductor silicon layer including an impurity layer formed therein to obtain a semiconductor layer having a desired thickness, wherein the trenches formed in the semiconductor silicon layer are exposed by removing the selected thickness of the semiconductor silicon layer and the semiconductor layer is separated into a plurality of regions by the exposed trenches;

forming an etch stop layer only on the semiconductor layer except the trenches;

forming a second oxide layer with a thickness sufficient to fill a region between stacked structure comprising the semiconductor layer and the etch stop layer;

etching the second oxide layer by means of the etch stop layer, wherein an isolation layer is formed at the region between the stacked structure; and removing the etch stop layer.

DESCRIPTION OF THE DRAWINGS

These and other features of the present invention can be readily understood with reference to the accompanying drawings.

DETAILED DESCRIPTION OF THE INVENTION

Figure 1A:
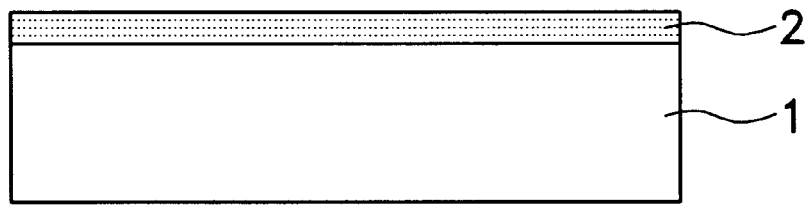
FIGS. 1A to 1D are cross-sectional views showing a conventional method of forming SOI substrate.
Figure 1B:
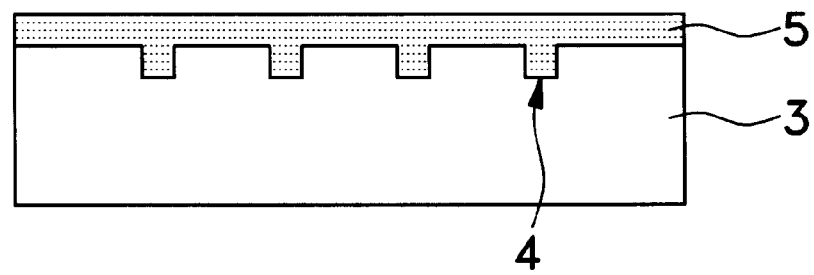
Figure 1C:
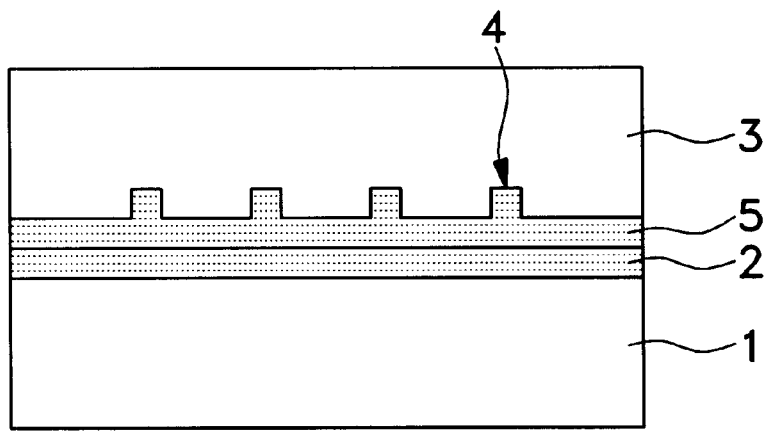
Figure 1D:
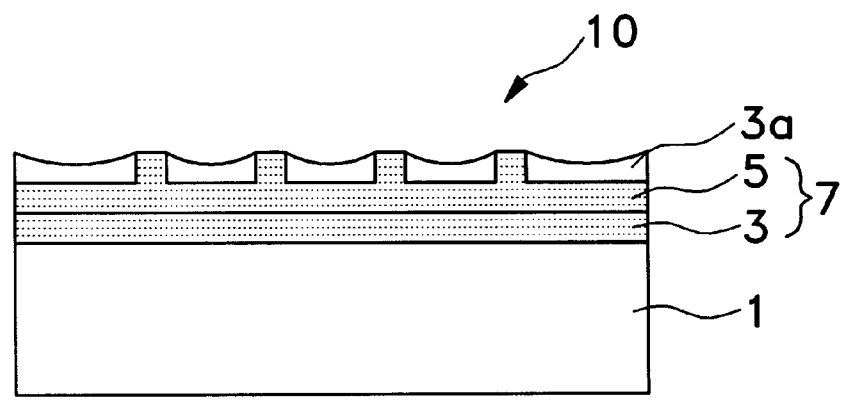
Figure 2A:
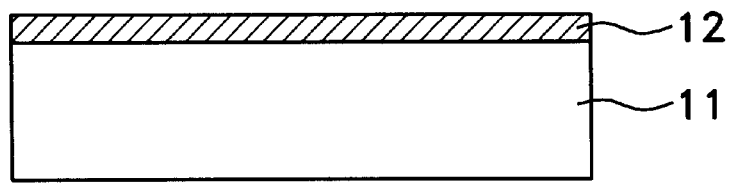
FIGS. 2A to 2J are cross-sectional views showing a manufacturing method of forming SOI substrate provided with an isolation layer according to one embodiment of the present invention.

Referring to FIG. 2A, a base silicon layer 11 acting as a means for supporting is provided, a buried oxide layer 12 such as a thermal oxide layer having a thickness range of 500~10,000 Å is formed by applying a thermal oxidation to one surface of the base silicon layer 11. Instead of the thermal oxide layer according to the thermal oxidation process, a chemical vapor deposition(CVD) oxide layer selected among BPSG layer, O3-TEOS layer or high density plasma according to the CVD process is available for the buried oxide layer 12.

Figure 2B:
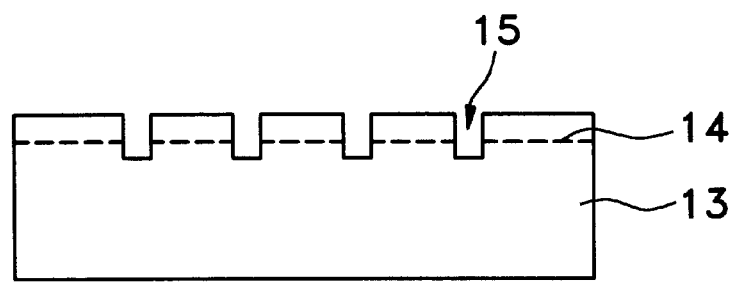

Referring to FIG. 2B, a semiconductor silicon layer 13 for forming a device is provided, a boron ion layer 14 is formed within the semiconductor layer 13 with a first depth from a surface of the semiconductor layer 13. The boron ion layer 14 is formed by implanting boron ions into the semiconductor silicon layer 13 with ion-implantation energy of 10~200 KeV and at a dose of $1.0 \times 10^{15} \sim 3.0 \times 10^{16}$ dose/cm², and then by annealing the boron ion-implanted semiconductor silicon layer 13 at an appropriate temperature. Trenches 15 are formed in the surface of the semiconductor silicon substrate 13 by a known etching process. The trench 15 is formed with a second depth that is deeper than the impurity layer 14 formed at the first depth.

Figure 2C:
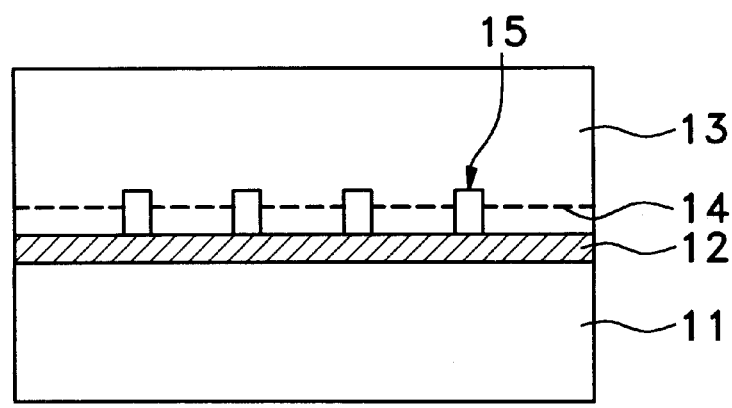

Referring to FIG. 2C, the base silicon layer 11 and the semiconductor silicon layer 13 are bonded under a vacuum condition of $7.5 \times 10^{-1} \sim 7.5 \times 10^{-4}$ so that the buried oxide 12 formed on the base silicon layer 11 and the surface of the semiconductor silicon layer where trenches are formed, are contacted each other. Next, the bonded base silicon layer 11 and the semiconductor silicon layer 13 are annealed at temperature range of 800~1,200° C. under nitrogen or oxygen atmosphere for 30~120 minutes so that the boding intensity therebetween is increased.

On the other hand, before the base silicon layer 11 and the semiconductor silicon layer 13 are bonded each other, they are cleaned with a first solution mixed with $NH_4OH$ and $H_2O_2$, or $H_2O$ at volume ratio of 1:4:20, or a second solution mixed with $H_2SO_4$ and $H_2O$ at volume ratio of 4:1, or they are cleaned with both first and second solutions in series so as to improve the hydrophile property of the respective bonding surfaces.

Figure 2D:
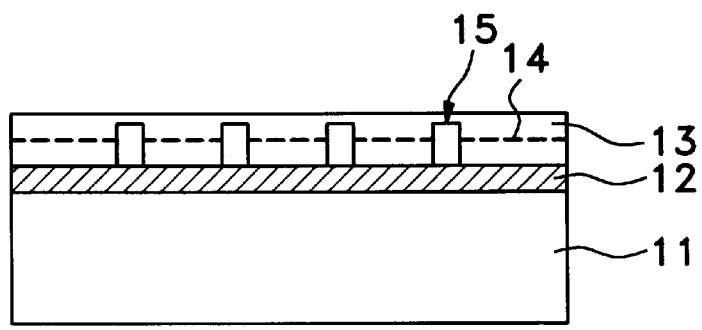

Referring to FIG. 2D, at first, backside of the semiconductor silicon layer 13 is polished to regions adjacent to the bottom of the trench by a known CMP process or an etch back process, more preferably, by the CMP process. Herein, thickness of the semiconductor silicon layer 13 remained on the bottom of the trench 15 is preferably in the range of 1,000~30,000 Å.

Figure 2E:
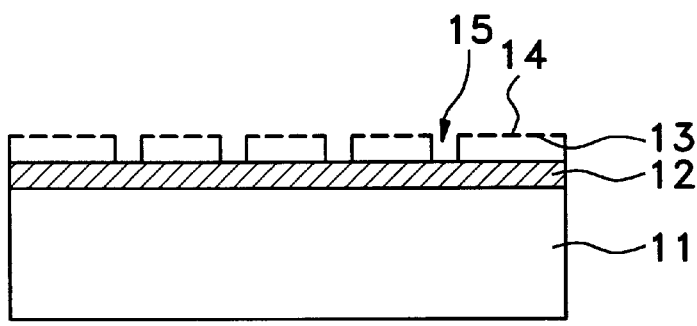

Referring to FIG. 2E, backside of the firstly polished semiconductor silicon layer 13 is removed by a wet-etching process until the boron ion layer 14 is exposed. Herein, the wet-etching process is performed by using an etchant mixed with $NH_4OH$, $H_2O_2$ and $H_2O$ at volume ratio of 1~2:0~0.02:1~5, and KOH mixed etchant is also available instead of the $NH_4OH$. As a result of the etching process, the trenches 15 formed in the semiconductor silicon substrate 13 are exposed and the remained semiconductor silicon layer 13 is divided by the trenches 15. At this time, the semiconductor silicon layer 13 has a uniform thickness owing to the boron ion layer 14.

Figure 2F:
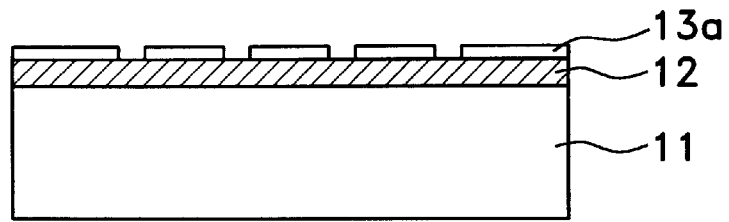

Referring to FIG. 2F, backside of the semiconductor silicon layer is polished secondly by the CMP process so that the boron ion layer is removed thereby obtaining a semiconductor layer 13a. The second CMP process is performed under such a condition that the rotary speed of chuck table is 10~30 rpm and the pressure of the spindle is 4~8 psi and the rotary speed of spindle is 20~40 rpm. Next, the semiconductor layer 13a is annealed at temperature range of 800~1,300° C. under hydrogen atmosphere for 30~120 minutes so as to remove the boron ions which may be remained on a surface of the semiconductor layer 13a completely, and so as to recover the crystalline property damaged during the above described processes.

Figure 2G:
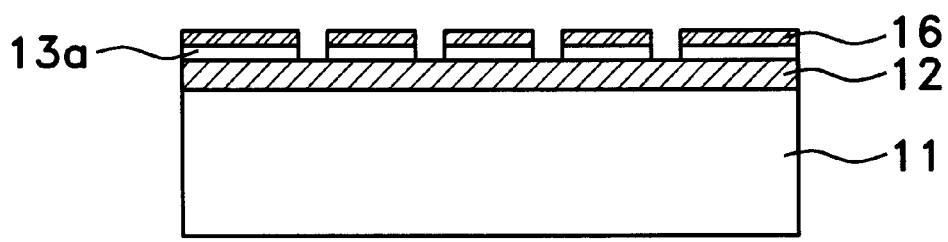

Referring to FIG. 2G, a silicon nitride layer 16 is deposited with a thickness sufficient to fill the trenches, for example 500~5,000 Å. And then, the silicon nitride layer 16 is etched such that the silicon nitride layer 16 is remained only on the semiconductor layer 13a except regions between the semiconductor layer 13a being separated by the trenches. Herein, the silicon nitride layer 16 remained in the semiconductor layer 13a acts as an etch stop layer during an etching process that will be performed in the subsequent processes.

Figure 2H:
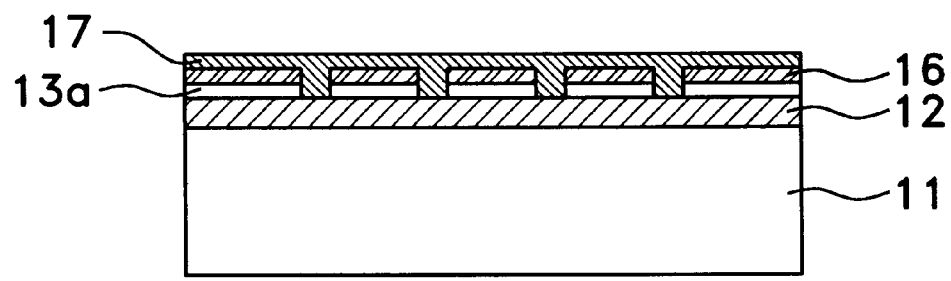

Referring to FIG. 2H, a silicon oxide layer 17 is deposited with a thickness, for example 1,000~20,000 Å, sufficient to fill regions between stacked structures of the semiconductor layer 13a and the silicon nitride layer 16.

Figure 2I:
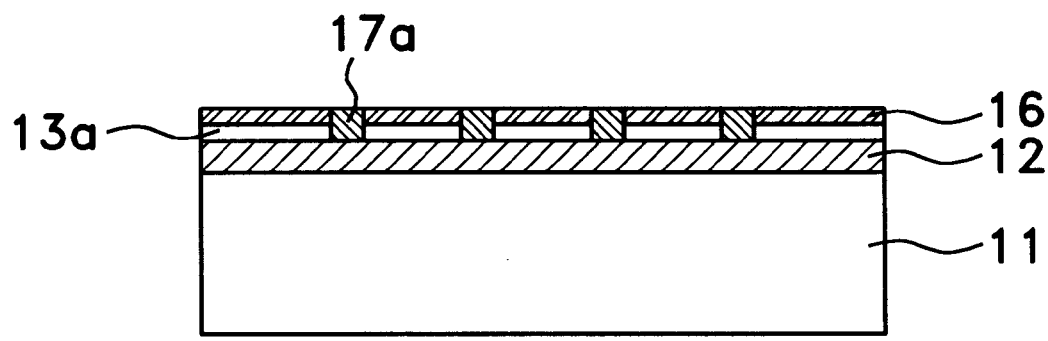

Referring to FIG. 2I, the silicon oxide layer 17 is etched by the etch back process using the silicon nitride layer 16 as the etch stop layer. Herein, a silicon oxide layer remained between the stacked structure of the semiconductor layer 13a and the silicon nitride layer 16 may become an isolation layer 17a.

Figure 2J:
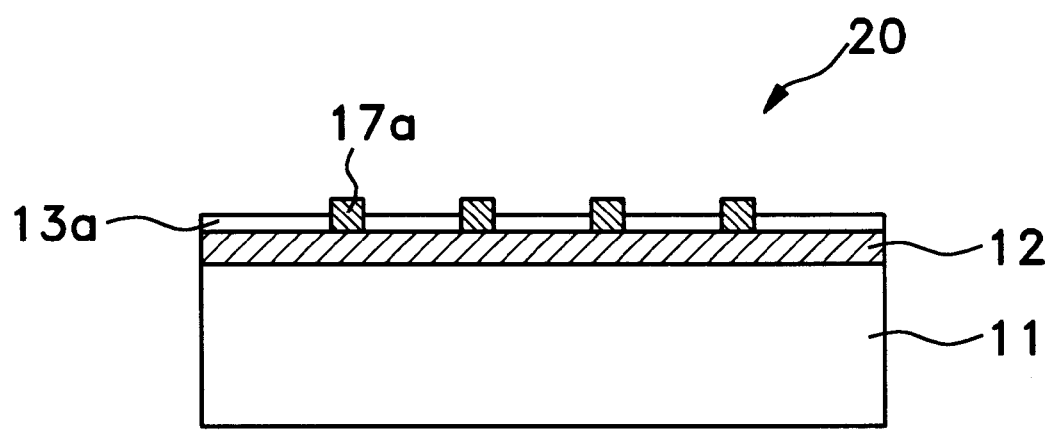

Referring to FIG. 2J, the silicon nitride layer used as the etch stop layer is removed thereby accomplishing an SOI substrate 20 provided with the isolation layer 17a.

As described above, a semiconductor layer having uniform thickness is obtained in the present invention since the thinning process to the semiconductor silicon layer is performed by using the boron ion layer. Furthermore, since the isolation layer is formed after the semiconductor layer is obtained, the occurrence of dishing at a surface of the semiconductor layer is prevented. Accordingly, the uniformity of thickness of semiconductor layer may be improved. Therefore, an enhanced property of a device formed on the semiconductor layer of the SOI substrate is expected.

Various other modifications will be apparent to and can be readily made by those skilled in the art without departing from the scope and spirit of the present invention.

What is claimed is:

1. A method of forming SOI substrate comprising the steps of:
    providing a base silicon layer and a semiconductor silicon layer;
    forming a buried oxide layer on the base silicon layer;
    forming trenches in the semiconductor silicon layer;
    bonding the base silicon layer and the semiconductor silicon layer so that the buried oxide layer and the trench-formed surface are contacted with each other;
    removing a selected thickness of the semiconductor silicon layer to obtain a semiconductor layer having a desired thickness, wherein the trenches formed in the semiconductor silicon layer are exposed by removing the selected thickness of the semiconductor silicon layer and the semiconductor layer is separated into a plurality of regions by the exposed trenches;
    forming an etch stop layer only on the semiconductor layer except the trenches;
    forming an oxide layer with a thickness sufficient to fill a region between stacked structures comprising the semiconductor layer and the etch stop layer;
    etching the oxide layer by means of the etch stop layer, wherein an isolation layer is formed at the region between the stacked structure; and
    removing the etch stop layer.

2. The method of claim 1, further comprising a step of forming an impurity layer within the semiconductor silicon layer before the step of forming trenches in the semiconductor silicon layer.

3. The method of claim 2, wherein the impurity layer is a boron ion layer.

4. The method of claim 3, wherein the boron ion layer is formed by ion-implanting boron ions into the semiconductor silicon layer at an ion-implantation energy of 10~200 KeV and a dose of $1.0 \times 10^{15}$~$3.0 \times 10^{16}$ dose/cm$^2$ and by annealing the boron ion-implanted semiconductor silicon layer.

5. The method of claim 3, wherein the boron ion layer is formed at a depth that is shallower than the trenches.

6. The method of claim 1, further comprising a step of making the bonding surface between the base silicon layer and the semiconductor silicon layer to be hydrophilic before the step of bonding the base silicon layer and the semiconductor silicon layer.

7. The method of claim 6, wherein the step of making the bonding surface to be hydrophilic is performed by cleaning the bonding surface with a first solution mixed with $NH_4OH$ and $H_2O_2$, or $H_2O$ at volume ratio of 1:4:20, or a second solution mixed with $H_2SO_4$ and $H_2O$ at volume ratio of 4:1, or both first and second solutions in series.

8. The method of claim 1, further comprising a step of annealing the base silicon layer and the semiconductor silicon layer to strengthen the bonding intensity therebetween, after the step of bonding the base silicon layer and the semiconductor silicon layer.

9. The method of claim 8, wherein the step of annealing is performed at temperature range of 800~1,200° C. under nitrogen or oxygen atmosphere for 30~120 minutes.

10. The method of claim 5, wherein the step of removing a selected thickness of the semiconductor silicon layer further comprises the steps of:
    firstly polishing backside of the semiconductor silicon layer to regions adjacent to the bottom of the trench;
    etching the backside of the firstly polished semiconductor silicon layer by using the boron ion layer as an etch stop layer; and
    secondly polishing the backside of the semiconductor silicon layer including the boron ion layer so as to obtain a semiconductor layer having a desired thickness.

11. The method of claim 10, wherein the step of etching the semiconductor silicon layer is performed by a wet-etching process using an etchant mixed with $NH_4OH$, $H_2O_2$ and $H_2O$ at volume ratio of 1~2 : 0~0.02 : 1~5.

12. The method of claim 10, wherein the step of etching the semiconductor silicon layer is performed by the wet-etching process using an etchant mixed with $KOH$, $H_2O_2$ and $H_2O$.

13. The method of claim 10, wherein the step of secondly polishing is performed under a condition that the rotary speed of chuck table is 10~30 rpm and the pressure of the spindle is 4~8 psi and the rotary speed of spindle is 20~40 rpm.

14. The method of claim 10, wherein further comprising a step of annealing the semiconductor layer so as to remove boron ions remained on the surface of the semiconductor layer and to recover the crystalline property, after the step of removing the selected thickness of the semiconductor layer.

15. The method of claim 14, wherein the step of annealing is performed at temperature range of 800~1,300° C. under hydrogen atmosphere for 30~120 minutes.

16. The method of claim 1, wherein the etch stop layer is a silicon nitride layer.

17. The method of claim 16, wherein the etch stop layer is formed by forming a silicon nitride layer with a thickness sufficient to fill the trenches and by patterning the silicon nitride layer to expose the trenches.

18. A method of forming SOI substrate comprising the steps of:
    providing a base silicon layer and a semiconductor silicon layer;
    forming a first oxide layer on the base silicon layer;
    forming an impurity layer with a first depth within the semiconductor silicon layer;
    forming trenches with a second depth in the semiconductor silicon layer, wherein the second depth is deeper than the first depth;

bonding the base silicon layer and the semiconductor silicon layer so that the first oxide layer on the base silicon layer and the trench-formed surface are contacted with each other;

removing a selected thickness of the semiconductor silicon layer including an impurity layer formed therein to obtain a semiconductor layer having a desired thickness, wherein the trenches formed in the semiconductor silicon layer are exposed by removing the selected thickness of the semiconductor silicon layer and the semiconductor layer is separated into a plurality of regions by the exposed trenches;

forming an etch stop layer only on the semiconductor layer except the trenches;

forming a second oxide layer with a thickness sufficient to fill a region between stacked structure comprising the semiconductor layer and the etch stop layer;

etching the second oxide layer by means of the etch-stop layer, wherein an isolation layer is formed at the region between the stacked structure; and removing the etch stop layer.

19. The method of claim 18, wherein the impurity layer is a boron ion layer.

20. The method of claim 19, wherein the boron ion layer is formed by ion-implanting boron ions into the semiconductor silicon layer at an ion-implantation energy of 10~200 KeV and a dose of $1.0 \times 10^{15}$~$3.0 \times 10^{16}$ dose/cm$^2$ and by annealing the boron ion-implanted semiconductor silicon layer.

21. The method of claim 18, further comprising a step of making the bonding surface between the base silicon layer and the semiconductor silicon layer to be hydrophilic before the step of bonding the base silicon layer and the semiconductor silicon layer.

22. The method of claim 21, wherein the step of making the bonding surface to be hydrophilic is performed by cleaning the bonding surface with a first solution mixed with $NH_4OH$ and $H_2O_2$, or $H_2O$ at volume ratio of 1:4:20, or a second solution mixed with $H_2SO_4$ and $H_2O$ at volume ratio of 4:1, or both-first and second solutions in series.

23. The method of claim 18, further comprising a step of annealing the base silicon layer and the semiconductor silicon layer to strengthen the bonding intensity therebetween, after the step of bonding the base silicon layer and the semiconductor silicon layer.

24. The method of claim 23, wherein the step of annealing is performed at temperature range of 800~1,200° C. under nitrogen or oxygen atmosphere for 30~120 minutes.

25. The method of claim 19, wherein the step of removing a selected thickness of the semiconductor silicon layer further comprises the steps of:

firstly polishing backside of the semiconductor silicon layer to regions adjacent to the bottom of the trench;

etching the backside of the firstly polished semiconductor silicon layer by using the boron ion layer as an etch stop layer; and secondly polishing the backside of the semiconductor silicon layer including the boron ion layer so as to obtain a semiconductor layer having a desired thickness.

26. The method of claim 25, wherein the step of etching the semiconductor silicon layer is performed by a wet-etching process using an etchant mixed with $NH_4OH$, $H_2O_2$ and $H_2O$ at volume ratio of 1~2:0~0.02:1~5.

27. The method of claim 25, wherein the step of etching the semiconductor silicon layer is performed by the wet-etching process using an etchant mixed with KOH, $H_2O_2$ and $H_2O$.

28. The method of claim 25, wherein the step of secondly polishing is performed under a condition that the rotary speed of chuck table is 10~30 rpm and the pressure on the spindle is 4~8 psi and the rotary speed of spindle is 20~40 rpm.

29. The method of claim 25, wherein further comprising a step of annealing the semiconductor layer so as to remove boron ions remained on the surface of the semiconductor layer and to recover the crystalline property, after the step of removing the selected thickness of the semiconductor layer.

30. The method of claim 29, wherein the step of annealing is performed at temperature range of 800~1,300° C. under hydrogen atmosphere for 30~120 minutes.

31. The method of claim 18, wherein the etch stop layer is a silicon nitride layer.

32. The method of claim 31, wherein the etch stop layer is formed by forming a silicon nitride layer with a thickness sufficient to fill the trenches and by patterning the silicon nitride layer so as to expose the trenches.

* * * * *